United States Patent
Feldmann

(10) Patent No.: US 8,211,627 B2
(45) Date of Patent: Jul. 3, 2012

(54) METHOD AND APPARATUS FOR STRUCTURING A RADIATION-SENSITIVE MATERIAL

(75) Inventor: Heiko Feldmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 733 days.

(21) Appl. No.: 12/345,960

(22) Filed: Dec. 30, 2008

(65) Prior Publication Data

US 2009/0191490 A1 Jul. 30, 2009

(30) Foreign Application Priority Data

Jan. 28, 2008 (DE) .......................... 10 2008 006 438

(51) Int. Cl.
*G03F 7/20* (2006.01)
*G02B 26/08* (2006.01)

(52) U.S. Cl. ......... 430/322; 430/323; 430/324; 359/298

(58) Field of Classification Search .................. 430/322, 430/323, 324; 355/55, 67, 77; 359/298
See application file for complete search history.

(56) References Cited

U.S. PATENT DOCUMENTS

| 6,388,661 B1 | 5/2002 | Richards |
| 6,391,245 B1 | 5/2002 | Smith |
| 6,586,160 B2 | 7/2003 | Ho et al. |
| 6,980,349 B1 | 12/2005 | Huibers et al. |
| 7,298,453 B2 | 11/2007 | Boettiger et al. |
| 2002/0030680 A1 | 3/2002 | Knebel et al. |
| 2002/0093632 A1 | 7/2002 | Teich et al. |
| 2005/0147895 A1 | 7/2005 | Chang et al. |
| 2005/0259785 A1 | 11/2005 | Zhang |
| 2010/0149503 A1* | 6/2010 | Goehnermeier ................ 355/55 |

FOREIGN PATENT DOCUMENTS

| EP | 1 519 227 | 3/2005 |
| JP | 2005-300715 | 10/2005 |
| WO | WO 2006/021818 | 3/2006 |
| WO | WO 2009/018846 | 2/2009 |

OTHER PUBLICATIONS

Steven G. Johnson, MIT, Course "Photonic Crystals, Periodic Surprises in Electromatnism," http://ab-initio.mit.edu/photons/tutorial/spie-course-new.pdf, 2003.
H. Wojciech et al., "65nm Feature Sizes Using Visible Wavelength 3-D Multiphoton Lithography," Optics Express, 2007, vol. 15, No. 6, p. 3426.
N. Dumbravescu, "3-D Resolution Gray-tone Lithography," Proc. SPIE vol. 4019, p. 570-577 (2000).

* cited by examiner

*Primary Examiner* — Shean Wu
(74) *Attorney, Agent, or Firm* — Fish & Richardson P.C.

(57) ABSTRACT

A method and to an apparatus for structuring a radiation-sensitive material are disclosed. The method can include using a dynamic mask to generate a first radiation pattern in a layer of the radiation-sensitive material, where the first radiation pattern has a thickness that is at most 50% of the thickness of the layer of the radiation-sensitive material. The method can also include using the dynamic mask to generate a second radiation pattern in the layer of the radiation-sensitive material. The dynamic mask can be configured to change its structure dynamically, and the first radiation pattern can be different from the second radiation pattern.

27 Claims, 5 Drawing Sheets

METHOD AND APPARATUS FOR STRUCTURING A RADIATION-SENSITIVE MATERIAL

CROSS-REFERENCE TO RELATED APPLICATION

This application claims benefit under 35 U.S.C. §119 of German patent application DE 10 2008 006 438.6, filed Jan. 28, 2008, the entire contents of which are hereby incorporated by reference.

FIELD

The disclosure relates to a method and to an apparatus for structuring a radiation-sensitive material.

BACKGROUND

Photon crystals, interconnection layers of semiconductor components and micromechanical elements can involve three-dimensional structuring of elements in the field of microelectronics. Often, generating three-dimensional structures involves lithographic methods in which semiconductor elements are generated layer by layer using different masks. Such methods can involve applying a photoresist, also called resist, to a carrier and exposing the photoresist using a first lithographic mask. This can be followed by a chemical development step in which the illumination pattern in the photoresist generated during the preceding exposure is translated into a physical structure in the photoresist. Here either exposed regions are removed from the photoresist or, conversely, exposed regions remain while the unexposed regions surrounding the latter are removed from the photoresist. The result is a two-dimensionally structured photoresist layer. A three-dimensional structure can be achieved by appropriately repeating these steps a number of times with different lithography masks.

SUMMARY

In some embodiments, the disclosure provides a method and/or an apparatus configured so that three-dimensional structuring of a radiation-sensitive material can be achieved in a relatively time-efficient and/or inexpensive manner.

In certain embodiments, the disclosure provides a method of structuring a radiation-sensitive material. The method can include providing a layer of the radiation-sensitive material, which is configured such that, when irradiated with a radiation intensity exceeding a threshold intensity, a characteristic property of the radiation-sensitive material is changed. The method can also include providing a dynamic mask which is configured to change its structure dynamically, and generating via the dynamic mask a first radiation pattern in the radiation-sensitive material layer such that the extension of the first radiation pattern, in which the radiation intensity exceeds the threshold intensity, is at most 50% of the thickness of the material layer in the thickness direction of the material layer at the individual points of the material layer. In addition, the method can include generating via the dynamic mask a second radiation pattern in the radiation-sensitive material layer.

In some embodiments, the disclosure provides an apparatus for structuring a radiation-sensitive material. The apparatus can include a holding device for holding a layer of the radiation-sensitive material which is configured such that, upon irradiation with a radiation intensity exceeding a threshold intensity, a characteristic property of the radiation-sensitive material is changed. The apparatus can also include a dynamic mask which is configured to change its structure dynamically. The apparatus can further include a control device which is configured to control the apparatus such that a first radiation pattern is generated via the dynamic mask in the radiation-sensitive material layer. The extension of the first radiation pattern, in which the radiation intensity exceeds the threshold intensity, is at most 50% of the thickness of the material layer in the thickness direction of the material layer at the individual points of the material layer. A second radiation pattern can also be generated via the dynamic mask in the radiation-sensitive material layer.

The radiation-sensitive material can, for example, be a so-called resist or photoresist (e.g., having a layer thickness of 10 μm). Upon irradiation with electromagnetic radiation, for example of a specific wavelength range, the radiation-sensitive material changes a characteristic property when the radiation exceeds a specific radiation intensity. In some embodiments, the change in the characteristic property can be that the radiation-sensitive material is changed upon exposure such that the radiation-sensitive material becomes chemically soluble so that in a subsequent chemical development step, contrary to the non-exposed material, the exposed portion of the radiation-sensitive material is removed. An example of this is positive resist. Conversely, in certain embodiments, the radiation-sensitive material can be configured (e.g., like a negative resist) so that the portion of the radiation-sensitive material that is not sufficiently exposed is removed in the development step.

In some embodiments, a first radiation pattern is generated in the radiation-sensitive material layer via a dynamic mask. The first radiation pattern can be substantially a radiation distribution extending two-dimensionally within the material layer, and can also extend in the thickness direction of the material layer. In certain embodiments, the extension of the radiation pattern in the thickness direction of the material layer is at most 50% of the thickness of the material layer at the individual points of the material layer (at respective surface points of the material layer in the perpendicular projection to the material layer). Here the extension of the radiation pattern is understood as meaning the extension in which the radiation intensity exceeds the threshold intensity of the radiation-sensitive material.

In certain embodiments, the radiation pattern has a depth of focus of at most 50% of the radiation-sensitive material. The mask with which the first radiation pattern is produced can be configured as a so-called "dynamic mask". Since this is not a conventional (static) mask, the structuring method can also be called a mask-free method. The dynamic mask is designed to change its structure dynamically, and can for example be designed as a micromirror array, which is sometimes called a DMD (Digital Micromirror Device).

By using a dynamic mask, a number of radiation patterns can be generated one after the other in the radiation-sensitive material without changing the mask. Therefore, the individual radiation patterns can be generated in rapid temporal succession. Furthermore, the method may not involve, for example, readjusting an additional mask so that the alignment of the individual radiation patterns in relation to one another can also be implemented with a high degree of precision. Because the extension of the first radiation pattern, in which the radiation intensity exceeds the threshold intensity, is at most 50% of the thickness of the layer in the thickness direction of the material layer at the individual points, it is possible to expose only a specific vertical partial region of the radiation-sensitive material or a partial layer of the radiation-sensitive material with the first radiation pattern.

By generating a second radiation pattern, another vertical region of the radiation-sensitive layer can be exposed. It is therefore possible to expose the radiation-sensitive layer plane by plane with the result being a three-dimensional structuring of the radiation-sensitive material. This means that by exposing different depth layers in the radiation-sensitive material layer with different radiation distributions, it becomes possible to provide the radiation-sensitive layer with a desired structure not just in the two dimensions of its main extension, but also in the direction of its thickness extension. In other words, the radiation-sensitive layer can be divided virtually into a number of slices lying on top of one another which are respectively provided separately with their own two-dimensional structuring.

In certain embodiments, the dynamic mask is in the form of a micromirror array. As already mentioned above, this type of micromirror array is sometimes called a DMD (Digital Micromirror Device). This type of micromirror array can, for example, include 10,000×10,000 mirrors which respectively have an area of 8×8 µm. The mirrors can be controlled individually. The micromirrors are for example mounted on special pivot pins and are tilted by electrostatic fields. The electrostatic fields are generated, for example, by switch logics located behind the micromirrors. By tilting a micromirror the beam reflected by this mirror can be deflected so that it no longer passes through downstream projection optics. In this way, by controlling the micromirror, the illumination of a pixel illuminated by this micromirror can be switched on or off. Using an array of 10,000×10,000 micromirrors, a pixel pattern of 10,000×10,000 pixels can be flexibly reconfigured (the pixel pattern can, for example, be reconfigured from the first radiation pattern into the second radiation pattern). In some embodiments, the mirrors can be reduced by a ratio of 1:267 when imaging onto the radiation-sensitive medium. This can produce a pixel size of 30 nm in the focus plane and a field size of 300 µm×300 µm. The vertical resolution or resolution in the thickness direction of the material layer can be estimated from a Strehl ratio of 80%, and this corresponds to a RMS wavefront deviation of $0.071\lambda$. In a horizontal direction the resolution can be estimated as $0.5\times\lambda/NA$. $\lambda$ is the wavelength of the light used for irradiating the radiation-sensitive material and NA the numerical aperture of projection optics used. Horizontal resolutions of for example 80 nm can therefore be achieved. Smaller dot sizes can be achieved by using non-linear resists, special illumination settings and by using resolution-enhancing methods, such as, for example, phase masks and off-center illumination.

In some embodiments, the radiation patterns are projected via projection optics with a numerical aperture of at least 0.9 (e.g., at least 1.2). With this type of high numerical aperture, a relatively small depth of focus can be achieved in the material layer. This can enable structuring of the radiation-sensitive material with high resolution in the thickness direction of the material layer.

In certain embodiments, the first radiation pattern in a region of the material layer is focused onto a first focus plane in relation to the material layer, and the second radiation pattern in the same region is focused onto a second focus plane in relation to the material layer. The second focus plane is advantageously offset in relation from the first focus plane in the thickness direction of the material layer. In other words, the first radiation pattern is focused onto a first focus position in relation to the material layer, and the second radiation pattern is focused onto a second focus position in relation to the material layer.

In certain embodiments, the extension of the second radiation pattern, in which the radiation intensity exceeds the threshold intensity, is at most 50% of the thickness of the material layer in the thickness direction of the material layer at the individual points of the material layer. This can enable independent structuring of individual layers within the material layer by the individual radiation patterns.

In some embodiments, the radiation patterns are respectively generated by an illumination distribution generated by the dynamic mask being projected via projection optics onto the material layer, and by obliquely moving the material layer to the focus plane of the projection optics. Here the rotational position of the material layer can basically be adjusted differently in relation to the focus plane. For example, the material layer can be aligned parallel to the focus plane or also have other rotational positions while it is moved obliquely to the focus plane. Using the oblique movement of the material layer, a region to be exposed can be disposed in temporal succession at different focus positions. If the structure of the mask is now changed dynamically and exposed at appropriate times onto the material layer, a number of radiation patterns can be generated in an efficient and time-saving way at different positions within the thickness extension of the material layer. In certain embodiments, the angle between the movement direction and the focus plane is 1.9°.

In some embodiments, the material layer is moved along a plane tilted in relation to the focus plane of the projection optics, and is thus aligned parallel to the tilted plane. This means that the material layer is moved in the plane in which it is disposed. The possibility is therefore offered of exposing points in different depth positions in relation to the material layer at the given time with an individual radiation pattern. This can enable particularly efficient three-dimensional structuring of the material layer because parallel structuring is thus made possible. At a given time, regions already previously exposed in a first depth layer can be structured in a second depth layer lying over the latter, whereas regions which are disposed in the second depth layer in the course of the moving or the scanning movement of the material layer at a later time can be structured in the first depth layer at the same time. In certain embodiments, the tilt angle between the material layer and the focus plane is 1.9°.

In some embodiments, after generation of the first radiation pattern, the material layer is moved in the thickness direction of the material layer, and the second radiation pattern is then generated. In particular, the radiation patterns can be generated by the respective illumination distribution generated by the dynamic mask projected onto the material layer via projection optics. After generation of the first radiation pattern, the material layer can be moved along the optical axis of the projection optics, and the second radiation pattern can then be generated. With this method the material layer can also be structured three-dimensionally in a very efficient way. Therefore, a thickness section of the material layer can be exposed with the first radiation pattern, and then a thickness section of the material layer lying directly beneath the exposed section can be exposed via the second radiation pattern. The material layer is then advantageously moved laterally to the optical axis so that a previously unexposed region of the material layer can be exposed with the next exposure step.

In certain embodiments, after generation of the two radiation patterns, the material layer is moved laterally to the thickness direction of the material layer (e.g., along the focus plane of the projection optics), and then once again two radiation patterns are generated which are focused onto different focus planes in relation to the material layer. This can allow for the generation of parallel, two-dimensional sections in the radiation-sensitive material.

In some embodiments, the radiation patterns are generated by a respective illumination distribution generated by the dynamic mask being projected onto the material layer via projection optics, and an aberration (e.g., spherical aberration of the projection optics) can be changed between the projections of the two radiation patterns. This can be desirable because, when generating the individual radiation patterns, the electromagnetic radiation penetrates through material layers of different thicknesses (the effective thickness of the material layer is different), which can lead to aberrations, such as dominantly spherical aberrations, when generating the individual radiation patterns. This effect can be compensated by dynamic adaptation of aberration (e.g., spherical aberration). This can be achieved, for example, by changing the position of moveable lens elements in the projection optics (e.g., using piezo-operated z manipulations).

In certain embodiments, upon generation of the radiation patterns, an immersion fluid is disposed on the radiation-sensitive material. The refraction index of the immersion fluid can correspond to the refraction index of the radiation-sensitive material. For example, the immersion fluid can fill an intermediate space between the projection optics and the radiation-sensitive material. By providing the immersion fluid (the refraction index of which corresponds to the refraction index of the radiation-sensitive material), the diffraction-limited projection may not be effected by the cross-over surface between the immersion fluid and the radiation-sensitive material.

In some embodiments, the radiation-sensitive material is in the form of nonlinear resist, such as 2 photon resist. These types of resist may not accumulate the exposure dose over a longer period, but can show a nonlinear reaction to the instantaneous intensity. It is therefore possible to achieve three-dimensional structuring in the dynamic scanning operation with high resolution.

In certain embodiments, upon generation of the radiation patterns, a plate of varying thickness made of translucent material are disposed above the radiation-sensitive material, and an intermediate space between the radiation-sensitive material and the plate is filled with an immersion fluid. The plate can compensate the aforementioned change in aberrations occurring (e.g., spherical aberrations). The plate can be, for example, a glass plate. With an effective thickness change of the resist between different illumination settings (e.g., the z distance between two different radiation patterns of +10 μm generated in the material layer), the layer of immersion fluid may advantageously have a thickness change of +5100 nm and the glass plate a thickness change of −14700 nm. In this case a wavelength λ of 193 nm and a numerical aperture (NA) of 1.2 is taken as a basis for the radiated electromagnetic radiation. The refraction index here is 1.7 for the radiation-sensitive material, 1.43 for the immersion fluid in the form of water, and 1.56 for the wedge-shaped plate of $SiO_2$.

In some embodiments, the plate is wedge-shaped, and the respective section of the radiation-sensitive material between the focus plane of the projection optics and the surface of the radiation-sensitive material facing towards the plate is also wedge-shaped in form. The wedge formed by the plate and the wedge formed in the radiation-sensitive material can have opposing orientations. With this orientation the aberrations that occur can be compensated particularly well.

In certain embodiments, the immersion fluid disposed between the plate and the radiation-sensitive material also fills a wedge-shaped volume. The wedge formed by the immersion fluid can have the same orientation as the wedge formed by the respective section of the radiation-sensitive material.

In some embodiments, the surface of the plate facing away from the immersion fluid and the respective focus plane of the radiation patterns are parallel to one another.

In certain embodiments, the latent images generated by the two radiation patterns in the radiation-sensitive material are developed at the same time by a single chemical development step. In certain conventional three-dimensional structuring methods, a first resist layer is first applied to a wafer, and the layer is then exposed and a chemical development takes place after the exposure step, whereupon a further resist layer is applied. It is possible according to the disclosure to develop the latent images generated in the individual depth layers of the radiation-sensitive material at the same time.

In some embodiments, the layer of the radiation-sensitive material has a thickness of less than 1 mm. Therefore the thickness of the layer is at no location on the layer larger than 1 mm. Optionally, the layer has a thickness of less than 100 μm (e.g., less than 20 μm). In certain embodiments, the layer has a uniform thickness within certain tolerances.

In some embodiments, the ratio between the thickness of the layer of the radiation-sensitive material and the area of the layer is less than $0.01\ m^{-1}$ (e.g., less than $0.001\ m^{-1}$). The area refers to the two-dimensional extension of the layer perpendicular to the thickness direction. In certain embodiments, the ratio between the thickness of the layer and the area exposed by the dynamic mask is less than $1\ m^{-1}$ (e.g., less than $0.01\ m^{-1}$).

In certain embodiments, the layer of the radiation sensitive material is arranged on a wafer used in semiconductor manufacturing, such as a silicon wafer. In some embodiments, the radiation sensitive material is coated onto the whole surface of the wafer, which can have a diameter of, for example, 200 mm or 300 mm.

The features specified with regard to embodiments of the method listed above can be applied correspondingly to the apparatus. Embodiments of the apparatus are included in the disclosure. Advantages listed above with regard to embodiments of the method also relate to the apparatus.

BRIEF DESCRIPTION OF THE DRAWINGS

In the following exemplary embodiments, a method and an apparatus for structuring a radiation-sensitive material are described in greater detail via the attached schematic drawings, in which.

DETAILED DESCRIPTION

In the exemplary embodiments described below, elements which are similar to one another functionally or structurally are generally provided with the same or similar reference numbers. Therefore, in order to understand the features of the individual elements of a specific exemplary embodiment, reference should be made to the description of other exemplary embodiments or to the general description.

Figure 1:
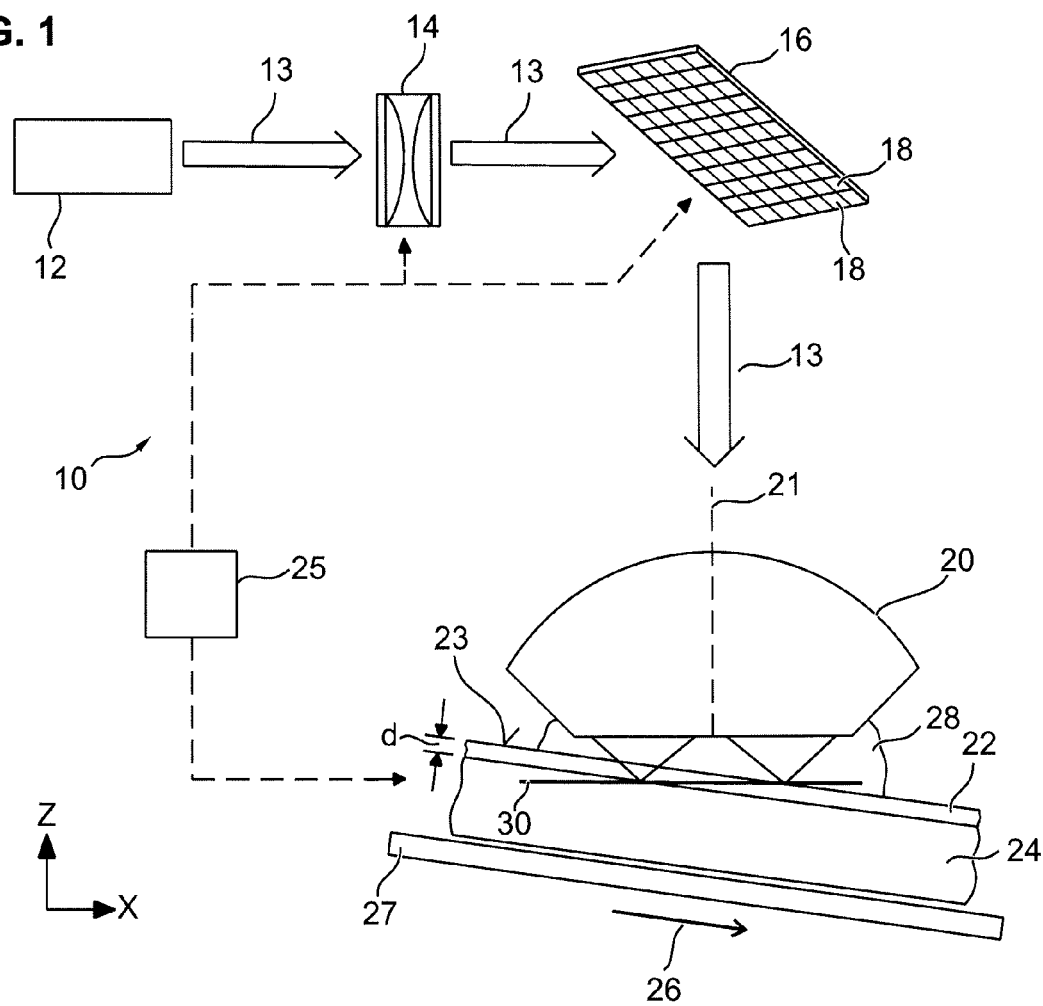
FIG. 1 shows an apparatus for structuring a radiation-sensitive material.

FIG. 1 shows an embodiment 10 of an apparatus for structuring a layer 22 of a radiation-sensitive material. The radiation-sensitive material layer 22 in the form of a photoresist or so-called resist used in microlithography is applied to the surface of a carrier 24 in the form of a wafer by coating. The wafer can have a diameter of, for example, 200 mm or 300 mm. The carrier 24 is held by a holding device 27 in the form of a moving stage or a so-called wafer stage. Furthermore, the apparatus 10 has a control device 25 for controlling the exposure sequences, including the dynamic mask 16 and the holding device 27.

The layer 22 of the radiation-sensitive material has a thickness d of, for example, 10 µm. The radiation-sensitive material is configured such that, upon irradiation with a radiation intensity exceeding a threshold intensity in a specific wavelength range, a characteristic property of the radiation-sensitive material is changed. For example, the radiation-sensitive material 22 can be chemically changed in the region exposed above the threshold radiation intensity such that in a subsequent development step the radiation-sensitive material 22 can be dissolved away, whereas the radiation-sensitive material irradiated with a radiation intensity below the threshold intensity remains unchanged. The radiation-sensitive material 22 can also be designed to act conversely so that only the material irradiated with a radiation intensity above the threshold intensity remains during the development step, whereas the material which has been irradiated with a radiation intensity below the threshold intensity is dissolved out.

The apparatus 10 includes a light source 12 for generating electromagnetic radiation. The wavelength of the electromagnetic beams generated by the light source 12 can be in the visible wavelength range, but can also be in the UV wavelength range, and can, for example, have a wavelength of 248 nm or 193 nm. The electromagnetic radiation 13 generated by the light source 12 is conveyed by illumination optics 14 disposed in the optical path to a dynamic mask 16. The dynamic mask 16 is in the form of a micromirror array, sometimes called a DMD (Digital Micromirror Device).

The micromirror array includes a field-shaped arrangement of 10,000×10,000 individual micromirrors 18 which respectively have a mirror surface of 8×8 µm. The micromirrors 18 are mounted on special pivot pins and can be tilted individually. The inclination of the micromirrors 18 is caused by electrostatic fields which are generated by switch logics located behind the micromirrors 18. An individual micromirror 18 forms an optical switch, and by tilting the micromirror 18 the light beam can be deflected to such an extent that it no longer falls into the recording region of downstream projection optics 20, and so is not imaged into the object plane or focus plane 30 of the projection optics 20. Each individual micromirror 18 generates one pixel of a radiation pattern in the focus plane 30. By adjusting the individual micromirrors 18 the assigned pixels can be switched on or off.

The projection optics 20 generally include a plurality of lens elements. For the sake of simplification only the final lens element in front of the wafer is shown in FIG. 1. The projection optics 20 have a high numerical aperture (NA), such as, for example, 1.2. Disposed between the surface 23 of the radiation-sensitive material 22 and the final element of the projection optics 20 is a so-called immersion fluid 28, such as, for example, water. In some embodiments, the refraction index of the immersion fluid 28 corresponds to the refraction index of the radiation-sensitive material 22. Therefore, the position of a cross-over surface between the immersion fluid 28 and the radiation-sensitive material 22 may not effect the diffraction limited projection. The projection optics 20 are designed to image the illumination pattern generated by the micromirror array with a reduction of 1:267, and this results in a pixel size of 30 nm with a field size of 300 µm×300 µm in the focus plane 30.

The carrier 24 in the form of a wafer, and so also the radiation-sensitive material layer 22 applied to the wafer, is tilted in relation to the focus plane 30 of the projection optics 20 by a tilt angle of approximately 1.9°. When structuring the material 22 the carrier 24 is moved along a movement direction 26 tilted by the same tilt angle in relation to the focus plane 30. The radiation-sensitive material layer 22 is therefore moved in the plane in which it extends.

Figure 2:
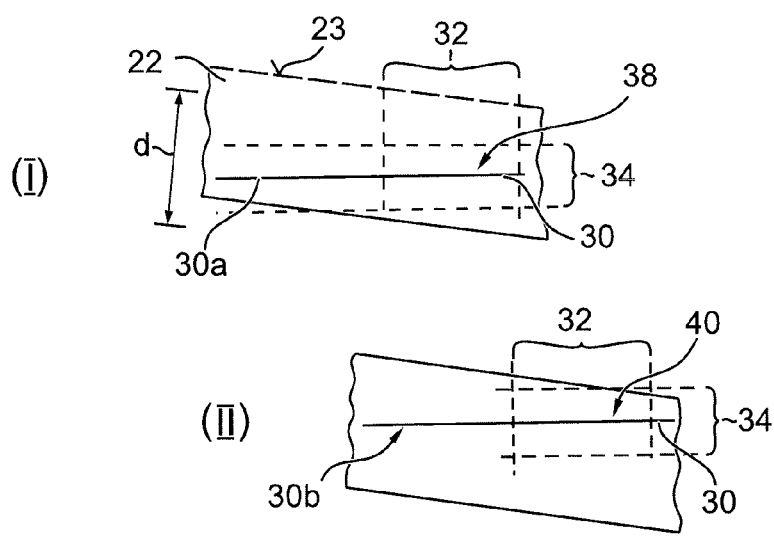
FIG. 2 shows a section of the radiation-sensitive material structured via the apparatus according to FIG. 1 in two different positions (I) and (II) during an exposure procedure.

FIG. 2 shows two different positions (I) and (II) of the radiation-sensitive material layer 22 during the scanning movement along the movement direction 26. In position (I) shown in the upper region of FIG. 2 a first radiation pattern 38 is generated in the material layer 22. The first radiation pattern 38 extends in a region of the material layer 22 to be structured identified by reference number 32. The focus plane 30 of the projection optics 20 is located in this region in a lower thickness section of the material layer 22 and is identified as the first focus plane 30a with reference to the material layer 22. The extension of the first radiation pattern 38 in which the radiation intensity exceeds the threshold intensity of the radiation-sensitive material 22, which is also called the depth of focus 34, is shown graphically in FIG. 2.

In the thickness direction of the material layer at the individual points of the material layer (on lines projected perpendicularly to the surface 23 of the material layer 22), this extension or depth of focus 34 is at most 50% of the thickness d of the material layer 22. However, the depth of focus 34 can also be smaller by orders of magnitude than the thickness d of the material layer. The result of the depth of focus 34 thus limited is that the material layer 22 is only exposed in a limited thickness section and that in the vertical direction adjacent sections remain unexposed. During the scanning movement along the movement direction 26, the radiation pattern changes little by little depending on pre-specified desired structuring of the region 32 in the vertical direction.

As an example, in the lower region of FIG. 2 a position identified by (II) is shown. In this position the region 32 to be structured is already pushed further to the right. In order to further expose the region 32 to be structured, another region in the image field of the dynamic mask 16 is illuminated. In position (II) the focus plane 30 of the projection optics 20 is located in a second focus plane 30b in relation to the material layer 22. In position (II) a second radiation pattern 40 is generated in the second focus plane 30b by the dynamic mask 16. The depth of focus 34 of the second radiation pattern 40 is also at most 50% of the thickness of the material layer 22.

Therefore, in position (II) a thickness section of the region 32 to be structured lying over the thickness section exposed in position (I) is exposed.

Figure 3:
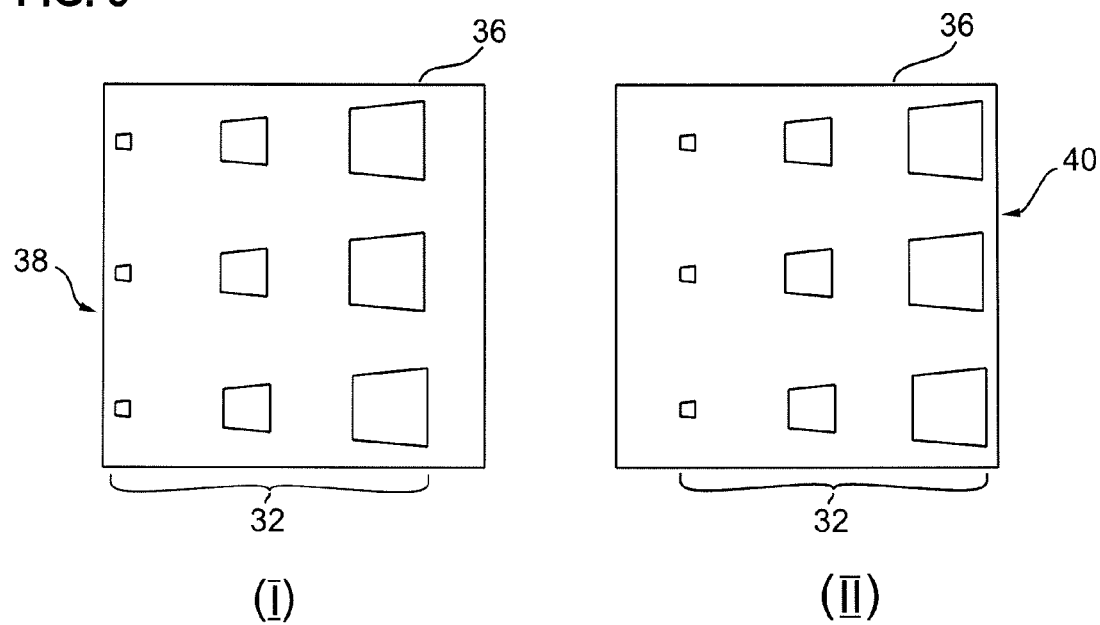
FIG. 3 shows examples of respective radiation patterns generated in the two positions (I) and (II) according to FIG. 2 in the radiation-sensitive material in a top view onto the radiation-sensitive material layer.

FIG. 3 shows examples of a first radiation pattern 38 and of a second radiation pattern 40 in the focus plane 30 (in a top view as observed in the direction of the optical axis 21 of the projection optics 20). The radiation patterns 38 and 40 are examples of radiation patterns generated in the material layer 22 in position (I) and position (II) according to FIG. 2, by which the three-dimensionally structured material layer 22 shown in FIG. 4 can be produced with individual pyramid-type structures. FIG. 3 respectively shows the field 36 on the material layer 22 which can be illuminated via the dynamic mask 16. Since in position (II) the region 32 to be structured is moved to the right in relation to position (I), the exposed structures of the second radiation pattern 40 generated in position (II) are moved to the right in relation to the exposed structures of the first radiation pattern 38 generated in position (I).

Figure 7:
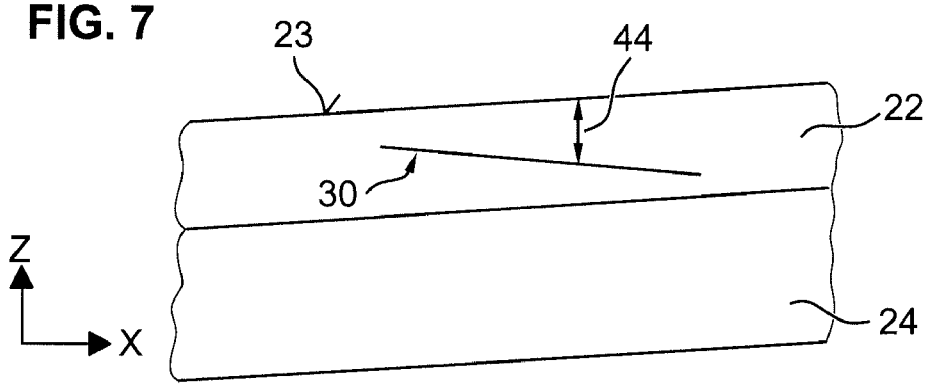
FIG. 7 shows a sectional view of the radiation-sensitive material during implementation of a method to illustrate the extension of the focus plane.
Figure 8:
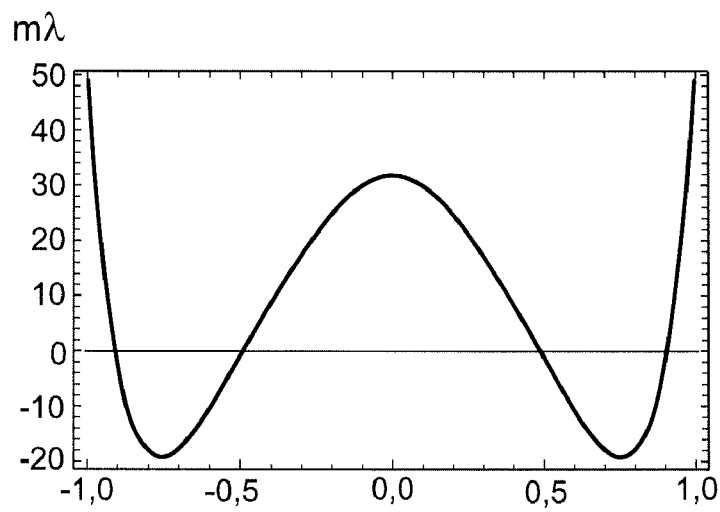
FIG. 8 illustrates the wavefront aberration in the outlet pupil when changing the thickness of the radiation-sensitive material by a certain amount.

FIG. 7 shows a further extension of the focus plane 30 in the radiation-sensitive material layer 22 deviating from the extension shown in FIG. 2 upon exposure by the apparatus according to FIG. 1. Since the focus plane 30 extends in the x direction obliquely to the surface 23 of the material layer 22, the effective thickness 44 through which the electromagnetic radiation 13 penetrates upon generation of the radiation pattern changes. This type of change to the effective thickness leads to wavefront aberrations, primarily spherical aberrations. FIG. 8 shows as an example the distribution of the wavefront aberrations in m$\lambda$ in the outlet pupil for a resist thickness change of 769 nm.

Figure 5:
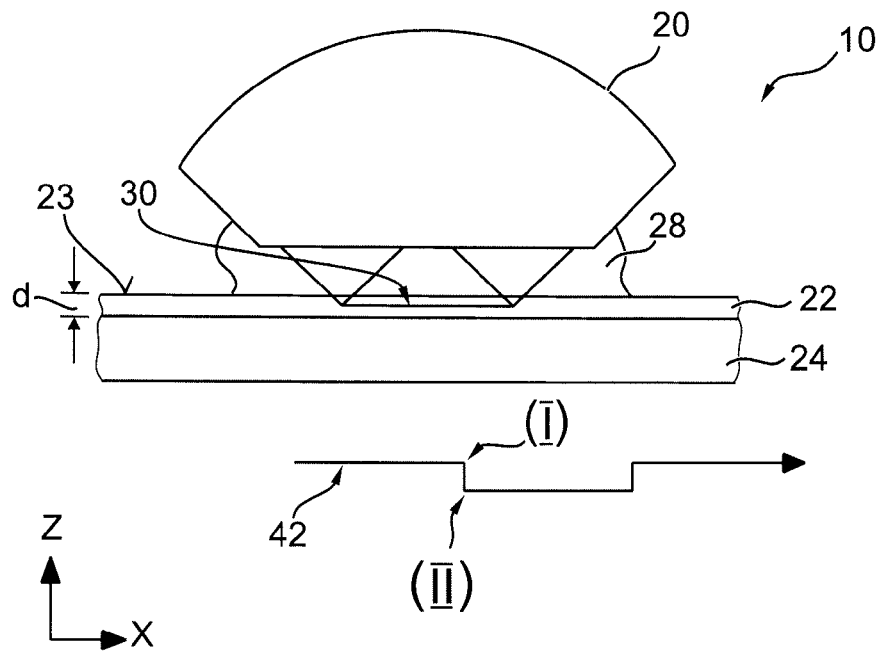
FIG. 5 shows a section of an apparatus for structuring a radiation-sensitive material.

FIG. 5 shows a section of an apparatus 10 for structuring a radiation-sensitive material 22 that differs from the apparatus 10 according to FIG. 1 only in that the carrier 24 with the radiation-sensitive material layer 22 is not scanned obliquely to the focus plane 30 of the projection optics as in FIG. 1. Instead, the carrier 24 is moved by the holding device in the form of a movement stage or wafer stage according to the movement pattern 42 shown in FIG. 5.

Figure 4:
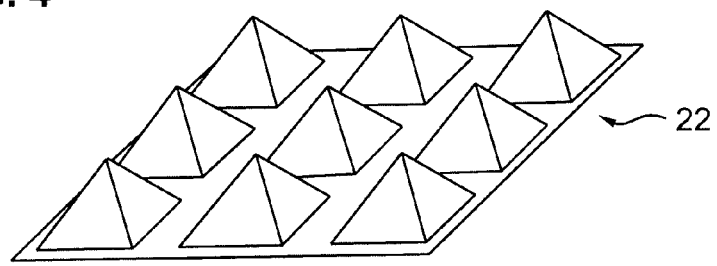
FIG. 4 shows a perspective view of a material layer structured via the radiation pattern shown in FIG. 3.
Figure 6:
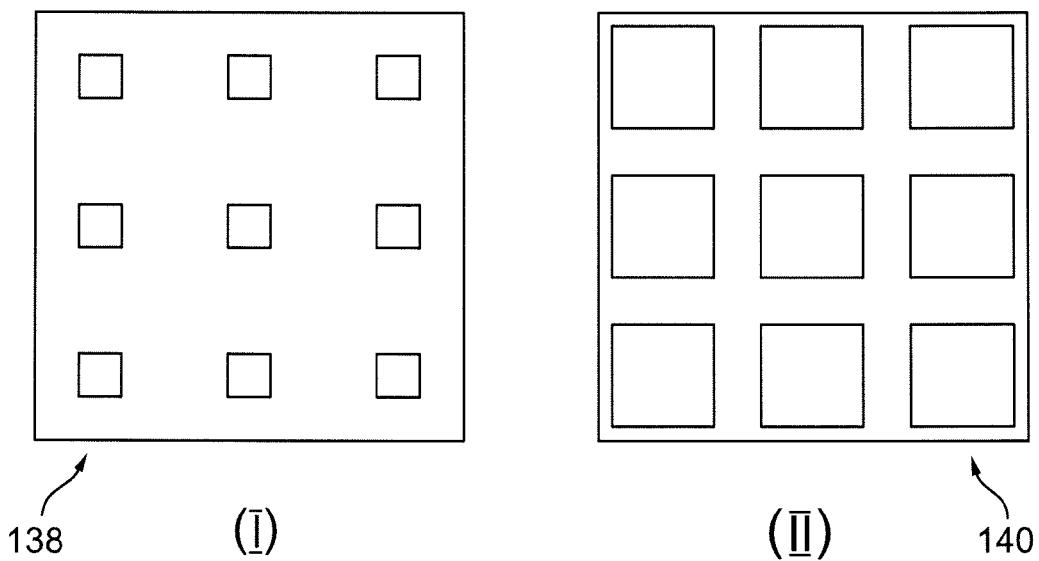
FIG. 6 shows examples of respective radiation patterns generated in two different positions (I) and (II) in the radiation-sensitive material in a top view onto the material layer.

FIG. 6 shows as an example a first radiation pattern 138 and a second radiation pattern 140 for structuring the object shown in FIG. 4. The structuring method illustrated in FIG. 5 proceeds as follows. The first radiation pattern 138 is projected into the radiation-sensitive material 22 in a position of the carrier 24 identified by (I). As with FIG. 1, the depth of focus 34 of the radiation pattern 138 is limited in the thickness direction of the material layer 22 to a fraction of the thickness d. After exposure of the first radiation pattern 138, the material layer 22 is moved downwards along the optical axis 21 of the projection objective 20 (in the z direction according to FIG. 1). In this position, identified by (II), a second radiation pattern 140, which is shown as an example in the right-hand region of FIG. 6, is exposed. The second radiation pattern 140 is therefore generated in a different depth layer than the first radiation pattern 138. In some embodiments, a plurality of radiation patterns are generated along vertical scans in the direction of the z axis. The carrier 24 is then moved in the x direction, and a correspondingly formed further radiation pattern is generated in a region of the material layer which has not yet been exposed. Here too, the carrier 24 is then moved vertically and at least one further exposure is performed.

In order to compensate the wavefront aberrations attributable to the varying effective thickness 44, in some embodiments, the spherical aberration of the projection optics 20 is changed between the projections of the two radiation patterns 138 and 140. For this purpose the projection optics 20 have moveable lens elements which are moved by piezo-operated z manipulators.

Figure 9:
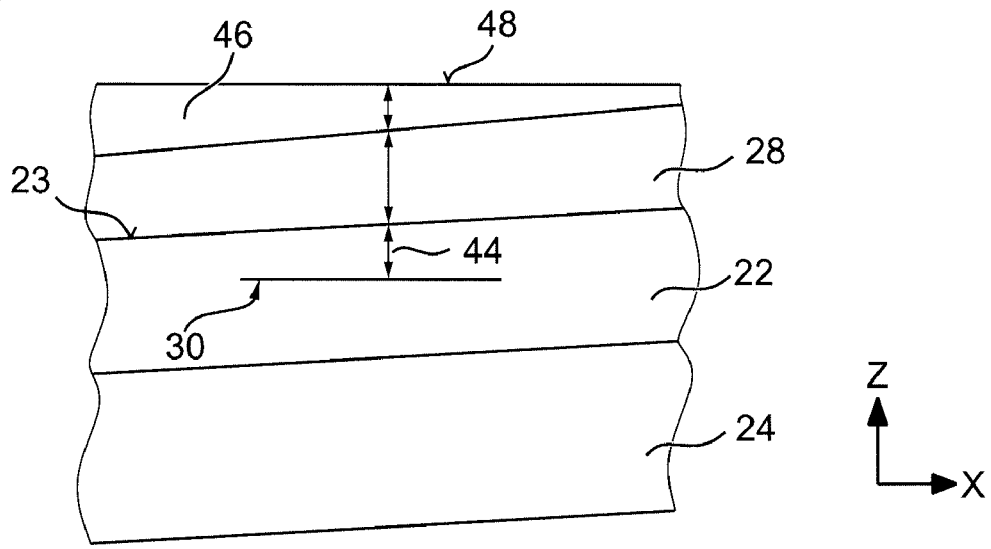
FIG. 9 shows a sectional view of an arrangement of different layers over the radiation-sensitive material.

FIG. 9 shows an embodiment for compensating the aberrations. For this purpose a plate 46 made of $SiO_2$ with a wedge-shaped cross-section is disposed above the material layer 22, the intermediate space between the plate 46 and the material layer 22 being filled with immersion fluid 28. The surface 48 of the plate 46 facing away from the immersion fluid 28 and the focus plane 30 are parallel to one another.

Figure 10:
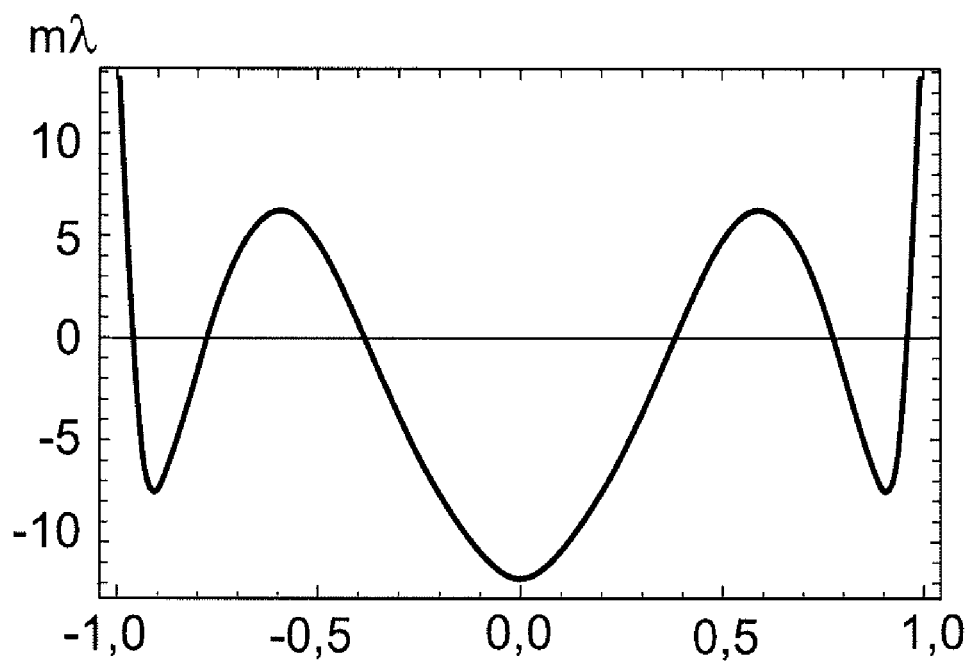
FIG. 10 shows the wavefront aberration according to FIG. 8 for the arrangement according to FIG. 9.

The section of the radiation-sensitive material 22 between the focus plane 30 and the surface 23 facing towards the plate 46 is wedge-shaped in form. The wedge formed by the plate 46 and the wedge formed by the section of the radiation-sensitive material 22 have orientations opposite one another. In some embodiments, a change in the effective thickness 44 of the radiation-sensitive material 22 is compensated in the x direction by +10,000 nm with a change in the thickness of the immersion fluid in the z direction by +5,100 nm and at the same time a change in the thickness of the plate 46 nm by −14,700 nm. With this compensation, for example, the wavefront aberration in the outlet pupil illustrated in FIG. 10, is produced. A wavelength $\lambda$ of 193 nm and a numerical aperture (NA) of 1.2 is used as a basis here for the radiated electromagnetic radiation. The refraction index here is 1.7 for the radiation-sensitive material 22, 1.43 for the immersion fluid in the form of water, and 1.56 for the wedge-shaped plate 46 made of $SiO_2$.

LIST OF REFERENCE NUMBERS 10 apparatus for structuring a radiation-sensitive material
12 light source
13 electromagnetic radiation
14 illumination optics
16 dynamic mask
18 micromirror
20 projection optics
21 optical axis
22 layer of radiation-sensitive material
23 surface
24 carrier
25 control device
26 movement direction
27 holding device
28 immersion fluid
30 focus plane of the projection optics
30a first focus plane in relation to the material layer
30b second focus plane in relation to the material layer
32 region to be structured
34 depth of focus
36 illuminatable field
38 first radiation pattern
40 second radiation pattern
42 movement pattern
44 effective thickness
46 plate
48 surface
138 first radiation pattern
140 second radiation pattern

What is claimed is:

1. A method, comprising:
using a dynamic mask to generate a first radiation pattern in a layer of the radiation-sensitive material; and
using the dynamic mask to generate a second radiation pattern in the layer of the radiation-sensitive material,
wherein:

the layer of the radiation-sensitive material has a thickness in a first direction which is perpendicular to a surface of the layer of the radiation-sensitive material;

the first radiation pattern has a thickness in the first direction that is at most 50% of the thickness of the layer of the radiation-sensitive material in the first direction;

the dynamic mask is configured to change its structure dynamically; and the first radiation pattern is different from the second radiation pattern.

2. The method according to claim 1, wherein the dynamic mask is a micromirror array.

3. The method according to claim 1, wherein the method comprises using projection optics with a numerical aperture of at least 0.9.

4. The method according to claim 1, wherein the first radiation pattern is focused in a first plane in the layer of radiation-sensitive material, the second radiation pattern is focused in a second plane in the layer of radiation-sensitive material, and the first plane is different from the second plane.

5. The method according to claim 1, wherein a thickness of the second radiation pattern in the first direction is at most 50% of the thickness of the layer of radiation-sensitive material in the first direction.

6. The method according to claim 1, further comprising:
using projection optics to project an illumination distribution generated by the dynamic mask onto the layer of the radiation-sensitive material to generate the first and second radiation patterns; and
obliquely moving the layer of radiation-sensitive material to a focus plane of the projection optics.

7. The method according to claim 6, wherein the layer of the radiation-sensitive material is tilted relative to the focus plane of the projection optics.

8. The method according to claim 1, further comprising:
after generating the first radiation pattern, moving the layer of the radiation-sensitive material in the first direction; and
subsequently generating the second radiation pattern.

9. The method according to claim 8, further comprising:
after generating the second radiation pattern, moving the layer of the radiation-sensitive material in a direction perpendicular to the first direction; and
subsequently generating third and fourth radiation patterns in the layer of the radiation-sensitive material, the third and further radiation patterns being in different planes of the layer of the radiation-sensitive material.

10. The method according to claim 1, wherein:
the first and second radiation patterns are generated by first and second illumination distributions, respectively, produced by the dynamic mask being projected onto the layer of the radiation-sensitive material via projection optics; and
an aberration of the projection optics is changed between the generation of the first and second radiation patterns.

11. The method according to claim 1, wherein an immersion fluid is disposed on the radiation-sensitive material, the refraction index of the immersion fluid corresponding to the refraction index of the radiation-sensitive material.

12. The method according to claim 1, wherein the radiation-sensitive material is a nonlinear resist.

13. The method according to claim 1, further comprising, before using the dynamic mask to generate the first radiation pattern in the layer of the radiation-sensitive material:
disposing a plate of translucent material between the dynamic mask and the radiation-sensitive material; and disposing an immersion fluid in between the radiation-sensitive material and the plate.

14. The method according to claim 13, wherein:
the plate is wedge-shaped;
a section of the radiation-sensitive material between a focus plane of the projection optics and the surface of the radiation-sensitive material facing towards the plate is also wedge-shaped in form; and
a wedge formed by the plate and the wedge formed in the radiation-sensitive material has opposing orientations.

15. The method according to claim 14, wherein the immersion fluid disposed between the plate and the radiation-sensitive material fills a wedge-shaped volume, and the wedge-shaped volume filled by the immersion fluid has the same orientation as the wedge formed by the section of the radiation-sensitive material.

16. The method according to claim 14, wherein the surface of the plate facing away from the immersion fluid and the focus plane of the projection optics are parallel to one another.

17. The method according to claim 1, further comprising using a single development step to develop at the same time latent images generated by the first and second radiation patterns in the layer of the radiation-sensitive material.

18. The method according to claim 1, wherein the layer of the radiation-sensitive material has a thickness of less than 1 mm in the first direction.

19. The method according to claim 1, wherein a ratio between the thickness of the layer of the radiation-sensitive material in the first direction and an area of the layer of the radiation-sensitive material is less than $0.01\ \text{m}^{-1}$.

20. The method according to claim 1, wherein the layer of the radiation-sensitive material is on a wafer configured to be used in semiconductor manufacturing.

21. The method according to claim 1, wherein a characteristic property of the layer of the radiation-sensitive material changes when irradiated with a radiation intensity exceeding a threshold intensity.

22. A method, comprising:
using a micromirror array to generate a first radiation pattern in a layer of the radiation-sensitive material; and
using the micromirror array to generate a second radiation pattern in the layer of the radiation-sensitive material, wherein:
the layer of the radiation-sensitive material has a thickness in a first direction which is perpendicular to a surface of the layer of the radiation-sensitive material;
the first radiation pattern has a thickness in the first direction which is at most 50% of the thickness of the layer of the radiation-sensitive material in the first direction; and
the first radiation pattern is different from the second radiation pattern.

23. The method according to claim 22, wherein the first radiation pattern is focused in a first plane in the layer of radiation-sensitive material, the second radiation pattern is focused in a second plane in the layer of radiation-sensitive material, and the first plane is different from the second plane.

24. The method according to claim 22, wherein a thickness of the second radiation pattern in the first direction is at most 50% of the thickness of the layer of radiation-sensitive material in the first direction.

25. The method according to claim 22, further comprising:
after generating the first radiation pattern, moving the layer of the radiation-sensitive material in the first direction; and
subsequently generating the second radiation pattern.

26. The method according to claim 25, further comprising:
after generating the second radiation pattern, moving the layer of the radiation-sensitive material in a direction perpendicular to the first direction; and
subsequently generating third and fourth radiation patterns in the layer of the radiation-sensitive material, the third and further radiation patterns being in different planes of the layer of the radiation-sensitive material.

27. The method according to claim 22, further comprising, before using the micromirror array to generate the first radiation pattern in the layer of the radiation-sensitive material:

disposing a plate of translucent material between the micromirror array and the radiation-sensitive material; and disposing an immersion fluid in between the radiation-sensitive material and the plate.

* * * * *

UNITED STATES PATENT AND TRADEMARK OFFICE
CERTIFICATE OF CORRECTION

PATENT NO. : 8,211,627 B2  Page 1 of 1
APPLICATION NO. : 12/345960
DATED : July 3, 2012
INVENTOR(S) : Heiko Feldmann It is certified that error appears in the above-identified patent and that said Letters Patent is hereby corrected as shown below:

Title Page, Column 2, Item (56) Other Publications, Line 2, delete "Electromatnism"
insert --Electromagnetism--.

Signed and Sealed this
Eleventh Day of September, 2012

David J. Kappos
*Director of the United States Patent and Trademark Office*